(12) United States Patent
Desbonnets et al.

(10) Patent No.: US 7,420,409 B2
(45) Date of Patent: Sep. 2, 2008

(54) PHASE LOCKED LOOP DEMODULATOR WITH GAIN CONTROL

(75) Inventors: Eric Desbonnets, Fontaine-Etoupefour (FR); Frédéric Parillaud, Caen (FR); Erick Giroux, Herouville Saint Clair (FR)

(73) Assignee: DSP Group Switzerland AG, Zurich (CH)

( * ) Notice: Subject to any disclaimer, the term of this patent is extended or adjusted under 35 U.S.C. 154(b) by 535 days.

(21) Appl. No.: 10/532,902

(22) PCT Filed: Oct. 9, 2003

(86) PCT No.: PCT/IB03/04508

§ 371 (c)(1),
(2), (4) Date: Apr. 27, 2005

(87) PCT Pub. No.: WO2004/040749

PCT Pub. Date: May 13, 2004

(65) Prior Publication Data

US 2006/0071708 A1 Apr. 6, 2006

(30) Foreign Application Priority Data

Oct. 30, 2002 (EP) .................................. 02292708

(51) Int. Cl.
*H03D 3/00* (2006.01)
(52) U.S. Cl. .................. 329/315; 329/325; 329/318; 331/16

(58) Field of Classification Search .................. 331/16, 331/1 A, 25; 375/376; 329/315, 318, 325
See application file for complete search history.

(56) References Cited

U.S. PATENT DOCUMENTS 5,369,376 A * 11/1994 Leblebicioglu ................. 331/8
5,459,653 A 10/1995 Seto

FOREIGN PATENT DOCUMENTS

EP 0645891 A 3/1995

OTHER PUBLICATIONS

Data Sheet, Integrated Circuits, UAA3515, 900MHz Analog Cordless Telephone IC, May 3, 2002, Product Spec. File under Integrated Circuits, IC17, Philips.

* cited by examiner

*Primary Examiner*—Arnold Kinkead
(74) *Attorney, Agent, or Firm*—Connolly Bove Lodge & Hutz LLP

(57) ABSTRACT

The invention relates to a demodulator to demodulate frequency-modulated signals FM including a phase locked loop PLL including at least a phase detector, a loop filter and a voltage controlled oscillator function VCO', characterized in that said voltage controlled oscillator function VCO' has modifiable gain. The invention allows to eliminate drawbacks presented by the conventional use of a complex gain modifiable amplifier at the input of demodulated signal processing means. Application: demodulation of modulated signals: wireless phone, home network.

5 Claims, 3 Drawing Sheets

PHASE LOCKED LOOP DEMODULATOR WITH GAIN CONTROL

FIELD OF THE INVENTION

The invention relates to the field of demodulation of modulated signals and amplification of demodulated signals obtained. More particularly, the invention relates to architecture of a circuit or a set of circuits realizing these functions. In its different applications, the invention notably relates to the reception of modulated signals like, for example, radio signals, telecommunication signals, telephone signals, audio base-band signals, wireless analog signals, video signals etc . . . The invention then also relates to any receiving system for such signals. Such receiving systems or devices can be a phone in wireless standard, DECT for example, a radio receiver, a wireless controller . . . Low cost wireless communications can also profit from the invention. The invention also proposes also a method for demodulating a modulated signal and amplifying the demodulated signal obtained.

BACKGROUND OF THE INVENTION

FIG. 1 presents a standard architecture of the demodulation of a modulated signal followed by an amplification of the demodulated signal obtained.

Such a standard architecture is for example implemented and described in the data sheet of UAA3515 from Philips semiconductors. In such architecture the demodulation is realized by a demodulator DEM using a conventional phase locked loop including a phase detector PDT, a loop filter LFI and a voltage controlled oscillator function VCO. Then the demodulated signal FDM is applied to a first amplifier stage G1 comprising a high gain amplifier G∝ and passive elements C1, R1 and R2. In integrated circuit technology, the use of passive elements generally implies the use of at least two connection pins P1 and P2 as shown in FIG. 1. Then the output of the amplifier stage G1 is conventionally connected using an intermediate filter INF to a second amplifier stage G2 including a complex gain control amplifier GGC. This second amplifier stage is then connected to a processor PRO that processes the signal so that this signal can be used.

Such architecture presents the drawbacks that two connection pins are needed, external components are needed that are found on a PCB and moreover impose their time constant (this time constant is even greater than the R1C1 multiplication and has to be high so as not to deform the audio signal), the presence is needed of a complex gain control amplifier that often deteriorate noise floor characteristics.

SUMMARY OF THE INVENTION

It is an object of the present invention to propose a new architecture realizing the demodulation of modulated signals and the amplification of the demodulated signal obtained, which architecture does not have the drawbacks of the above-presented architecture and enables an enhanced quality for the signals finally used.

To this end, the invention proposes a demodulator to demodulate frequency-modulated signals including a Phase locked loop including at least a phase detector, a loop filter and a voltage controlled oscillator function VCO, characterized in that said voltage controlled oscillator function VCO has modifiable gain.

Said modifiable gain being implemented in the voltage controlled oscillator function VCO allows the frequency variations of the Frequency-modulated signals to be amplified. Consequently, the demodulated frequency-modulated signals are amplified when output from the phase locked loop. The modifiable gain can be implemented in various ways within the voltage controlled oscillator function.

According to an advantageous embodiment, the modifiable gain of said voltage controlled oscillator function VCO is modifiable using a programmable transconductance. In this advantageous embodiment the voltage controlled oscillator function VCO is controlled by the current output from a programmable transconductance. Said programmable transconductance allows the transformation of a voltage into current, said transformation generating a current as low as amplification desires. The less important said output current of said programmable transconductance is, the most important the amplification versus the frequency variations is. Said advantageous embodiment is particularly adapted to standard Intermediate Frequencies IF used in wireless communication: 450 kHz, 10.7 MHz.

According to a preferred embodiment of the invention, the programmable transconductance includes a fixed transconductance and a current multiplier, the output of said programmable transconductance being the output of a summation unit that sums a combination of at least one output of said multiplier.

In an advantageous implementation, said second current is taken from an intermediate output of said current multiplier using digitally programmable switches and preferentially MOS switches. The command of said MOS switches may then be provided by a digital command on a given number of bits for example, said bits corresponding to the activation of said MOS switches.

The invention also relates to an electronic device able to receive frequency-modulated signals characterized in that demodulation of said signals is realized by a demodulator as described above. A method for demodulating frequency-modulated signals according to the invention is also proposed and includes the steps of applying said frequency-modulated signals at the input of a phase locked loop includes at least a phase detector, a loop filter and a voltage controlled oscillator function VCO, increases frequency variations by increasing gain of the voltage controlled oscillator function VCO having a modifiable gain and produces demodulated signals at the output of said phase locked loop.

BRIEF DESCRIPTION OF THE DRAWINGS

The invention is described hereafter in detail with reference to the diagrammatic Figures wherein.

DESCRIPTION OF EMBODIMENTS

Figure 1:
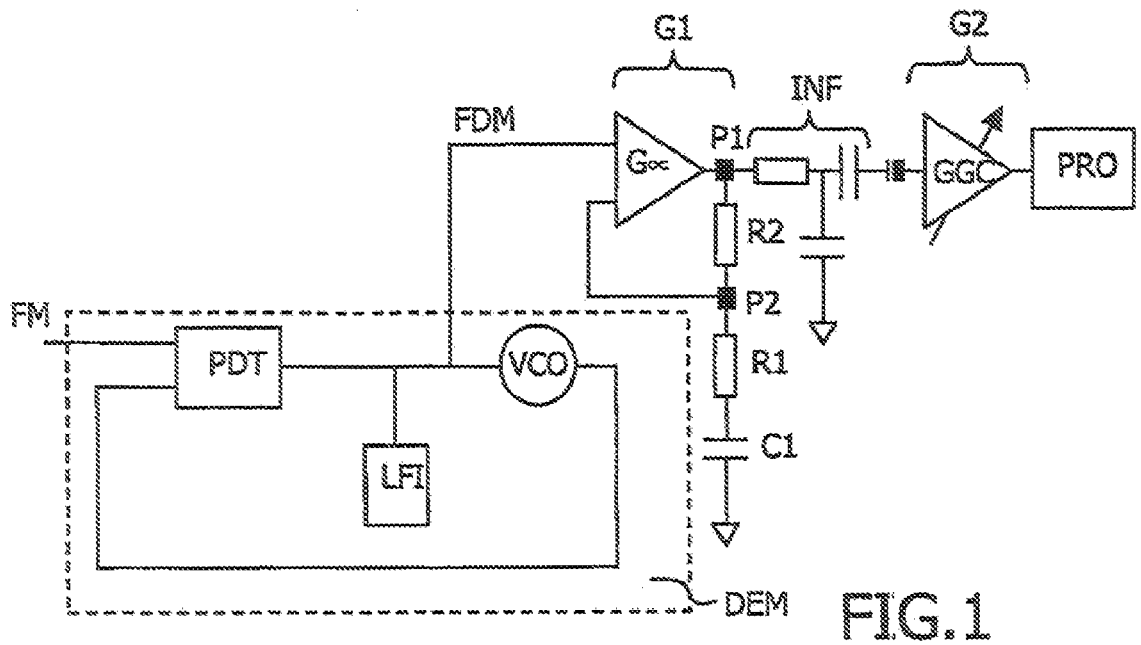
FIG. 1 represents the standard architecture of a demodulator followed by amplification of demodulated signals according to the state of the art.

FIG. 1 represents the standard architecture of a demodulator DEM followed by amplification of demodulated signals according to the state of the art in a specific second amplifier stage G2 including a complex gain control amplifier GGC. This Figure has been described above.

In an application, the demodulator receives frequency-modulated signal:

$$FM = A \cdot \cos[2\pi f_c t + (f_{dev}/f_{mod})\sin(2\pi f_{mod} t)].$$

$f_{dev}$ is the deviation of the frequency, $f_{mod}$ is the modulation frequency, $f^c$ the central frequency of the Voltage Controlled Oscillator function VCO. Said central frequency $f_c$ may be the inherent oscillation frequency of an oscillator included in the function VCO or a divided-by-M own oscillation frequency of an oscillator included in the function VCO, said inherent oscillation frequency being equal to several times M of the central frequency fc, and said oscillator being followed by a divide-by-M divider. In this case, the function VCO is considered to include the divider. Any structure known for a voltage controlled oscillator function VCO allowing having a frequency centered on the modulation frequency of the received signals can be implemented in the state of the art and in the invention. The invention includes supplementary features independently of such means to center the frequency of the voltage controlled oscillator function on the modulation frequency.

The audio processor PRO input signal is then:

$$(f_{dev}/K_{VCO}) \cdot G1 \cdot G2 \cdot \sin(2\pi f_{mod} t).$$

$K_{VCO}$ is the gain of the VCO, this gain is fixed in the state of the art. G1 and G2 represent here the value gain of the two amplifier stages G1 and G2. The gain G2 is modifiable to adapt the amplification of the signal input in the audio processor PRO. The amplitude of the modification of the gain is advantageously centered on a mean value that corresponds to the most commonly required level of amplification by an exploitation system implemented at the output of the audio processor PRO. Such an exploitation system can be, for example, an earpiece with loudspeaker. The modification of the gain of amplifier stage G2 then enables to increase and decrease the gain around this mean value.

Such architecture presents some drawbacks. This architecture conventionally needs external passive elements R1, R2, C1 and two output pins in order to realize connections with those external passive elements. This architecture is limited in terms of settle time by the R1, C1 time constant. It has a major impact on the standby mode of a telephone for example. This architecture also needs a complex gain control amplifier GGC in the second amplifier stage G1. The DC offset of such a complex amplifier GGC limits the audio processor noise floor performances. As the gain control is used after an output pin, the signal level on this output pin is lower than in the invention. It makes the architecture less robust to the ground audio bounce on PCB. The invention allows to avoid all these drawbacks by providing a high-quality demodulation and amplification of the demodulated signals with a very simple new architecture.

The main function achieved by the invention is the demodulation of frequency-modulated signals with gain control of the output signals directly done in the phase locked loop within the voltage controlled oscillator function VCO.

Figure 2:
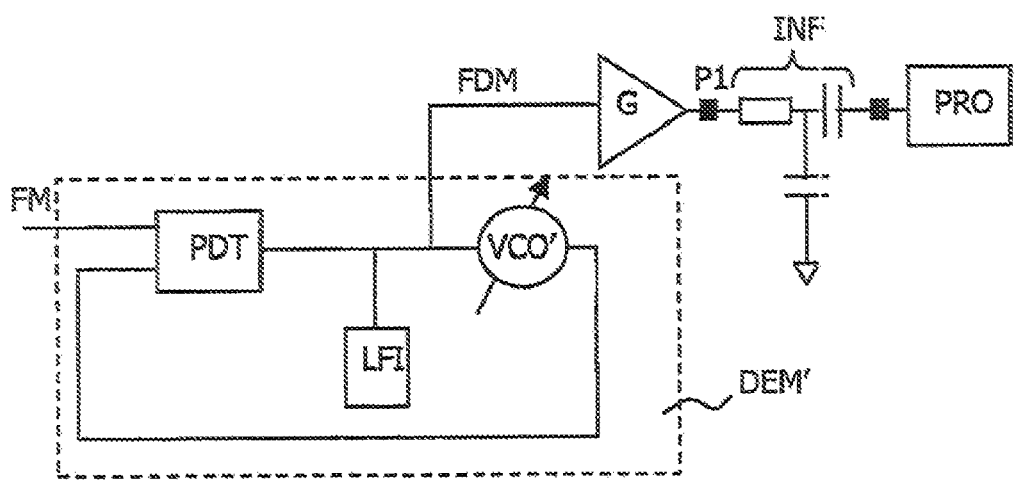
FIG. 2 represents the new architecture of a demodulator with integrated gain control according to the invention.

FIG. 2 represents the new architecture of a demodulator DEM' with integrated gain control according to the invention. The phase locked loop includes a voltage controlled oscillator function VCO' with modifiable gain. This modifiable gain allows to increase or decrease the gain of the voltage controlled oscillator function VCO' to adapt the level of the input of an audio processor PRO directly in the phase locked loop. Such a modifiable gain voltage controlled oscillator function VCO' can be implemented in various ways.

Figure 3:
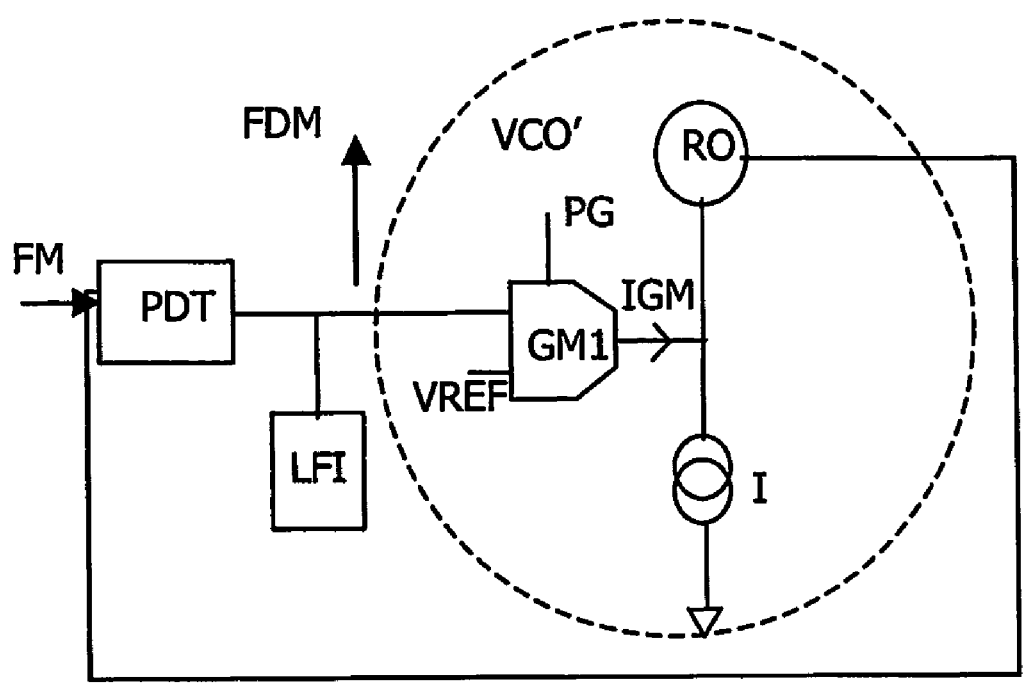
FIG. 3 represents an advantageous embodiment of means to modify the gain of the voltage controlled oscillator function according to the invention using a programmable transconductance.

An advantageous embodiment is then proposed in FIG. 3. This embodiment is particularly adapted to standard Intermediate Frequencies IF modulated signals (450 kHz, 10.7 MHz for example). The voltage controlled oscillator function VCO' includes a Relaxation Oscillator RO. Relaxation Oscillators are known to one skilled in the art. It is constituted by a capacitor, which is charged and discharged by a current. This charge and discharge represent the period of the oscillator. As seen hereinabove, said relaxation oscillator RO can, independently of the invention, be followed by a current divider to center the frequency of the voltage controlled oscillator function VCO' on the modulation frequency of the received signals. The functioning of the Relaxation Oscillator RO is controlled by the sum of two currents: I that conventionally enables the frequency of the VCO' to be centered on the modulation frequency and IGM coming from the phase locked loop and representing the frequency variations due to the frequency modulation. According to the invention, the current IGM passes through a programmable transconductance GM1. According to programmation data PG, the transconductance GM1 has the ability to provide a dependence on the programmation data PG, more or less important current IGM for a given voltage difference between the output of said loop filter and a reference voltage VREF. Then the gain of the voltage controlled oscillator function VCO' is proportional to the value of the programmable transconductance GM1. A particular and preferred use of the programmable transconductance GM1 will be presented in the following.

Figure 4:
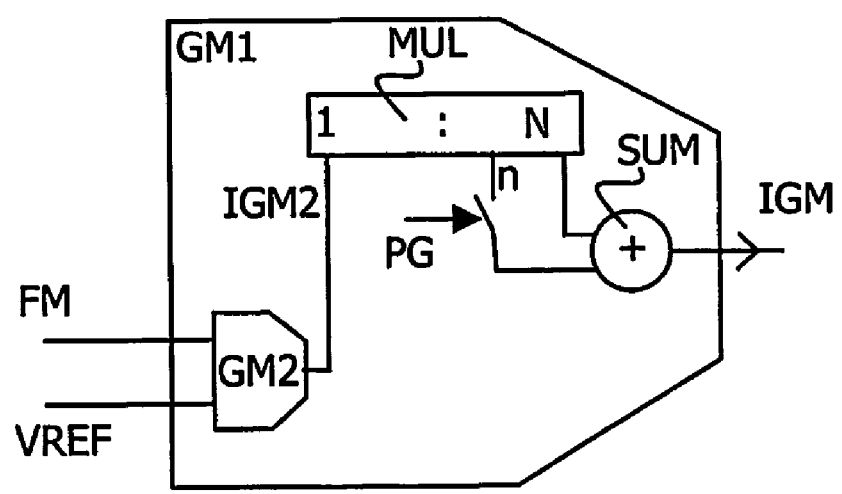
FIG. 4 represents a preferred use of the programmable transconductance.

FIG. 4 presents a preferred use of the programmable transconductance GM1. Said programmable transconductance GM1 includes a fixed transconductance GM2 conventionally known in the state of the art. The output of this fixed transconductance is a current IGM2. As explained above in the description of FIG. 1, the amplification needed is generally dedicated to adapt the level of the input signal of the audio processor in order to obtain usable signals at the output of this audio processor. According to the architecture of the invention represented in FIG. 2, the audio processor input signal is equal to:

$$(f_{dev}/K_{VCO}) \cdot G \cdot \sin(2\pi f_{mod} t).$$

$K_{VCO}$ is modifiable here. Its value has to be centered on a value that enables a mean value that corresponds to the most commonly required level of amplification by an exploitation system implemented at the output of the audio processor PRO. The amplitude of variation of $K_{VCO}$ can also be determined. For example, it is then considered in the following that the current IGM2 is a maximum value for IGM that corresponds to a maximum of $K_{VCO}$ and consequently to a minimum of the audio processor input signal. Then, said programmable transconductance GM1 advantageously includes also a binary weighted current multiplier MUL presenting, in this particular example, a ratio $1/2^N$ with N=1 to n at each of its outputs. Such a definition here means that a current equal to $IGM2/2^n$ is provided on output n of the multiplier MUL, n being included in interval [1:N]. In this embodiment, conventional current multiplication means like current mirrors can be used in the invention. According to the preferred embodiment of the invention, switches S[n] are connected to the multiplier outputs. Said switches are then linked to a summation unit SUM. The switches are controlled by programmation data PG made of n bits. It has to be noted that, in FIG. 4, a single output n and a single switch are represented for clarity. A summation unit SUM is connected to said switches. The summation unit SUM output current IGM is equal to $$IGM2 \times \sum_{n/PG} (1/2^n).$$

For example, for programmation data PG in 3-bit-code 101, the output current IGM is: IGM2×(1×½+0×¼+1×⅛)=0.625 IGM2. Said outputs can also be permanently connected to the summation unit SUM.

The summation unit SUM can sum as many currents as there are permanently connected outputs, or outputs connected via a switch. Any combination of the outputs of the multiplier MUL is possible according to the invention. Any kind of output of a multiplier may also be used according to the invention. Multiplier MUL outputs may be any kind of multiple of the multiplier input current IGM2. Amplitude of modification of IGM is then defined by an interval of current, defined by limits that can be taken by the sum. Said interval is advantageously centered on the above-invoked mean value.

It may also happen that IGM2 is a minimum value that corresponds to the higher possible required gain. In this case, the multiplier, for example, provides IGM2 and the summation is an integer multiple of IGM2. A multiplier according to the invention can also provide any multiple of IGM2 at its outputs, said multiples being then summed according to the invention. In this case, for example, $$IGM = IGM2 \sum_{n/PG} 2^{n-1}.$$

For example, for a 3-bit-code 101, the output current is: IGM2×(1×4+0×2+1×1)=7×IGM2.

According to the invention, the voltage controlled oscillator function VCO' includes a multiplier. The modification of the gain of the voltage controlled oscillator function VCO' is then realized using commutation of currents. The decreasing of the gain results in an amplification of the frequency variations in the Relaxation Oscillator VCO for a given signal. Consequently, the formed demodulated signal FDM is amplified in a customizable way regarding what would have been obtained with a fixed transconductance GM2. The change of the gain of the voltage controlled oscillator function VCO' generates a change in the output gain. It has to be noted that the gain of the amplifier of the first amplifier stage in the architecture of the state of the art has to be high (conventionally around 20) while the gain of G needs generally to be around 1 or 2.

The invention enables to reduce the time necessary to establish a balance in the receiving chain of a reception device compared to the state of the art. Effectively, the invention allows not to be limited by the time constant of external elements. The invention allows not to have external elements. The invention allows to reduce the silicon size required to realize functions of gain control amplification more than 100 times (no complex gain control amplifier). The invention allows not to need a complex gain control amplifier. The DC offset of the latter amplifier induces limitations in the noise floor performance of the audio processor. According to the invention, the DC offset of the amplification is removed before the audio processor by the AC coupling realized by the filter INF in FIG. 2. As the gain control is implemented before the output pin, the signal level on this pin is higher than in the state-of-the-art architecture. It makes the architecture more robust relative to the ground audio bounce on PCB.

Consequently, the new architecture according to the invention provides an amplification equivalent to the one realized in the state of the art without having the drawbacks of the latter. In summary, the invention allows improvements concerning silicon occupation, audio quality, pinning count, external components and PCB area. System consumption is also reduced as the settling time of the receiver is reduced (no more time constant). Effectively, the standby time being reduced, the consumption is reduced.

Figure 5:
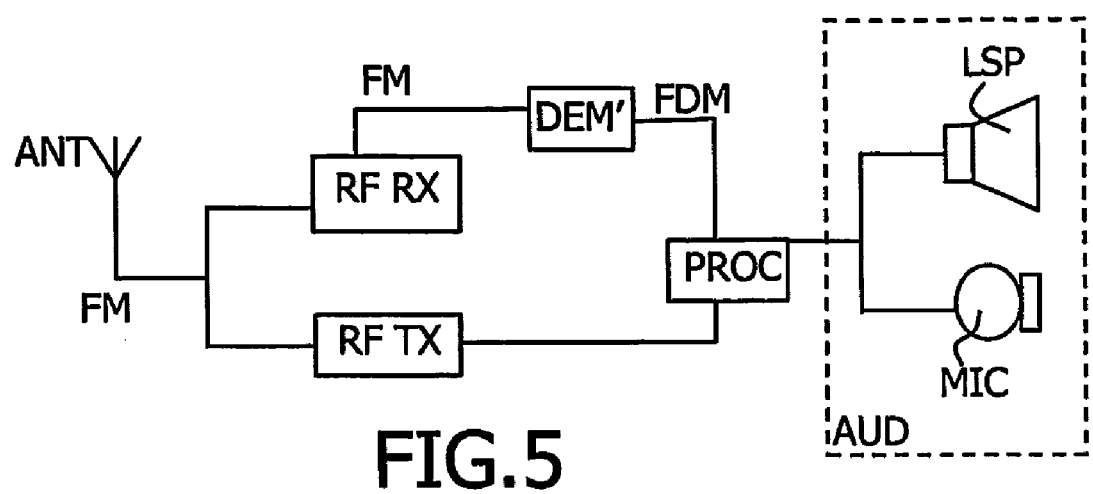
FIG. 5 illustrates a receiving device according to the invention.

FIG. 5 illustrates a receiving device according to the invention. This Figure is a highly schematic representation of such a receiving device. It includes at least an antenna ANT at least able to receive frequency-modulated signals FM (Radio-Frequency RF or other), a demodulator DEM' according to the invention, a receiving chain RX with a processing unit PROC. Said receiving chain RX and demodulator DEM' are advantageously connected to an audio system AUD and allow the use of demodulated signals FDM. This can be an earpiece with a loudspeaker LSP. Advantageously the receiving device also includes a transmission chain IX advantageously linked to the processing unit PROC and to the audio system AUD. This is the case with telephone for example. Then the audio system also includes a microphone MIC for example.

Figure 6:
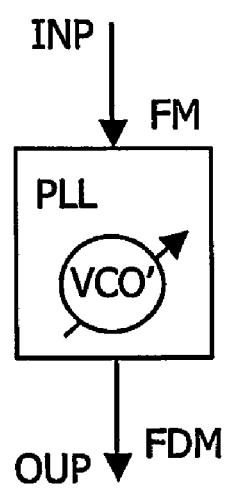
FIG. 6 is a block diagram of a method to demodulate a signal according to the invention, said block diagram also describing schematically the invention according to the abstract.

FIG. 6 is a block diagram of a method to demodulate a signal according to the invention, said block diagram also describing schematically the invention according to the abstract. A method for demodulating frequency-modulated signals according to the invention includes the step INP of applying frequency-modulated signals FM to an input of a phase locked loop PLL which includes at least a phase detector, a loop filter and a Voltage controlled oscillator function VCO', the step of amplifying frequency variations by modifying/decreasing gain of the voltage controlled oscillator function VCO', said voltage controlled oscillator function VCO' having a modifiable gain, the step OUP of producing demodulated signals FDM at an output of the phase locked loop PLL.

The architecture strictly as disclosed in FIG. 2 and the embodiments presented in FIGS. 3 and 4 are not exclusive. Other alternative architectures and embodiments may be derived in accordance with principles of the invention defined in the claims to accomplish the same objectives.

The invention claimed is:

1. A demodulator to demodulate frequency-modulated signals including a phase locked loop including at least a phase detector, a loop filter and a voltage controlled oscillator function VCO, characterized in that said voltage controlled oscillator function VCO has a modifiable gain, wherein the gain of said voltage controlled oscillator function VCO is modifiable using a programmable transconductance, and wherein the programmable transconductance includes a fixed transconductance, a current multiplier, the output of said programmable transconductance being the output of a summation unit that sums a combination of at least one output of said multiplier.

2. A demodulator as claimed in claim 1, wherein a current is taken from an intermediate output of said current multiplier using digitally programmable switches.

3. A demodulator as claimed in claim 2, wherein said switches are MOS switches.

4. An electronic device able to receive frequency-modulated signals characterized in that demodulation of said signals is realized by a demodulator as claimed in one of the claims 1 or 2 or 3.

5. A method for demodulating frequency-modulated signals including the steps of:
   applying said frequency-modulated signals at the input of a phase locked loop including at least a phase detector, a loop filter and a voltage controlled oscillator function VCO,
   wherein the gain of said VCO is modifiable using a programmable transconductance, and wherein the programmable transconductance includes a fixed transconductance, a current multiplier, the output of said programmable transconductance being the output of a summation unit that sums a combination of at least one output of said multiplier, increasing frequency variations by increasing gain of the voltage controlled oscillator function VCO having a modifiable gain, producing demodulated signals at the output of said the phase locked loop.

* * * * *